(12) United States Patent
Kasai et al.

(10) Patent No.: US 11,340,283 B2
(45) Date of Patent: May 24, 2022

(54) TESTING DEVICE

(71) Applicant: TOKYO ELECTRON LIMITED, Tokyo (JP)

(72) Inventors: Shigeru Kasai, Nirasaki (JP); Masahito Kobayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/976,672

(22) PCT Filed: Feb. 19, 2019

(86) PCT No.: PCT/JP2019/005988
§ 371 (c)(1),
(2) Date: Aug. 28, 2020

(87) PCT Pub. No.: WO2019/171932
PCT Pub. Date: Sep. 12, 2019

(65) Prior Publication Data
US 2020/0408828 A1    Dec. 31, 2020

(30) Foreign Application Priority Data

Mar. 5, 2018   (JP) .............................. JP2018-038843

(51) Int. Cl.
   *G01R 31/26*     (2020.01)
   *H01L 21/26*     (2006.01)
(52) U.S. Cl.
   CPC ..... *G01R 31/2635* (2013.01); *G01R 31/2619* (2013.01); *H01L 21/26* (2013.01)

(58) Field of Classification Search
None
See application file for complete search history.

(56) References Cited

U.S. PATENT DOCUMENTS 8,107,801 B2 *   1/2012   Shimizu ............ H01L 21/67115
                                                    392/418
8,246,900 B2 *   8/2012   Kasai .................. H01L 31/1864
                                                    266/250
(Continued)

FOREIGN PATENT DOCUMENTS

JP    H10-135315 A      5/1998
JP    2010-14421 A      1/2010
(Continued)

*Primary Examiner* — Jermele M Hollington
(74) *Attorney, Agent, or Firm* — Nath, Goldberg & Meyer; Jerald L. Meyer; Tanya E. Harkins

(57) ABSTRACT

A testing device for inspecting an electronic device by causing contact terminals to electrically contact the electronic device, includes: a mounting table formed with a light transmission member opposite the side on which a inspection object is placed and having therein a coolant flow path through which a coolant capable of transmitting light flows; a light irradiation mechanism disposed so as to face the surface opposite the inspection object placement side of the mounting table, and having LEDs pointing toward the inspection object; and a controller controlling absorption of heat by the coolant and heating by the lights from the LEDs to control the temperature of the electronic device to be inspected. The controller controls the light output from the LEDs based on the measured temperature of the electronic device to be inspected and controls the absorption of heat by the coolant based on the LED light output.

9 Claims, 14 Drawing Sheets

(56) References Cited

U.S. PATENT DOCUMENTS

| | | | | |
|---|---|---|---|---|
| 8,897,631 B2* | 11/2014 | Kasai | ................ | H01L 21/67115 |
| | | | | 392/407 |
| 2010/0038833 A1* | 2/2010 | Kasai | ................ | H01L 21/67115 |
| | | | | 266/250 |
| 2012/0279944 A1* | 11/2012 | Kasai | ................ | H01L 21/67109 |
| | | | | 219/50 |
| 2014/0270731 A1* | 9/2014 | Gerling | ............ | H01L 21/67115 |
| | | | | 392/408 |
| 2020/0386805 A1* | 12/2020 | Kasai | ................ | G01R 31/2601 |
| 2020/0408828 A1* | 12/2020 | Kasai | ................ | G01R 31/2635 |
| 2021/0102991 A1* | 4/2021 | Kasai | ................ | G01R 31/2635 |
| 2021/0247248 A1* | 8/2021 | Kobayashi | ............ | G01K 1/026 |
| 2021/0247786 A1* | 8/2021 | Kobayashi | ........ | H01L 21/67115 |

FOREIGN PATENT DOCUMENTS

| | | | |
|---|---|---|---|
| KR | 10-2005-0027543 A | 3/2005 | |
| KR | 10-2013-0000340 A | 1/2013 | |

\* cited by examiner

Time (s)

TESTING DEVICE

CROSS-REFERENCE TO RELATED APPLICATION

The present application is based on and claims priority from Japanese Patent Application No. 2018-38843, filed in Japan on Mar. 5, 2018, the disclosure of which is incorporated herein in its entirety by reference.

The present disclosure relates to a testing device for inspecting an electronic device mounted on a mounting table.

BACKGROUND

In a semiconductor manufacturing process, a plurality of electronic devices having a predetermined circuit pattern are formed on a semiconductor wafer (hereinafter, referred to as a "wafer"). The formed electronic devices are inspected for electrical characteristics or the like, and are sorted into non-defective products and defective products. For example, the inspection of electronic devices is performed on a wafer before the wafer is divided into electronic devices using a testing device.

A testing device for an electronic device, which may be called a prober or the like (hereinafter, referred to as a "prober"), includes a probe card having a number of pin-shaped probes, a mounting table for mounting a wafer thereon, and an IC tester (see Patent Document 1). This prober inspects electrical characteristics of the electronic devices by bringing respective probes of the probe card into contact with electrode pads or solder bumps installed correspondingly to the electrodes of the electronic devices, and transmitting signals from the electronic devices to an IC tester. In addition, in the prober of Patent Document 1, when inspecting the electrical characteristics of the electronic devices, the temperature of the wafer is controlled by controlling the temperature of the mounting table by a coolant flow path and a heater installed in the mounting table in order to emulate the implementation environment of the electronic devices.

PRIOR ART DOCUMENTS

Patent Documents

Patent Document 1: Japanese Laid-Open Patent Publication No. 10-135315

In recent years, electronic devices have become faster and smaller, and thus the degree of integration has increased and the amount of heat generated during operation thereof has increased significantly. Therefore, during the inspection of an electronic device on a wafer, a thermal load may be applied to other electronic devices, which may cause problems in the other electronic devices.

As a method for preventing this problem from occurring, a method of suppressing the application of thermal load to the other electronic device by controlling the temperature of the electronic device under inspection using the coolant flow path or the heater provided in the mounting table in the prober as shown in Patent Document 1 may be considered. However, in the case of using the coolant flow path and the heater in the mounting table, even though the temperature of the wafer may be controlled as a whole, it is impossible to suppress the application of a thermal load to other electronic devices by controlling the temperature of the wafer locally, for example, controlling the temperature only in the vicinity of the electronic device under inspection. This is because it is difficult to reduce the size of the coolant flow path and the heater, and thus it is difficult to locally arrange the coolant flow path and the heater in the mounting table.

Therefore, the application of a thermal load to other adjacent electronic devices is avoided, for example, by making the voltage applied to the electronic device under inspection lower than the implementation voltage to be applied in the implementation environment which is relatively high. As a result, however, it is impossible to find a problem that occurs during the application of an implementation voltage until the electronic device is packaged, which results in a decrease in the yield of a package and causes an increase in cost.

An object of the technology according to the present disclosure is to provide a testing device for an electronic device capable of suppressing an increase in the cost of an electronic device.

SUMMARY

According to one embodiment of the present disclosure, there is provided a testing device that brings a contact terminal into electrical contact with an electronic device formed on an inspection object so as to inspect the electronic device, the testing device including: a mounting table including a coolant flow path through which a coolant capable of transmitting light flows, configured to mount the inspection object thereon, and having a side which is opposite a placement side of the inspection object and formed by a light transmission member; a light irradiation mechanism having LEDs disposed to face a surface on the side opposite the placement side of the inspection object of the mounting table, the LEDs being directed toward the inspection object; and a controller configured to control heat absorption by the coolant and heating by light from the LEDs so as to control a temperature of the electronic device to be inspected, wherein the controller is configured to: control a light output from the LEDs based on at least a measured temperature of the electronic device to be inspected; and control the heat absorption by the coolant based on the light output of the LEDs.

According a testing device of an aspect of the present disclosure, it is possible to suppress an increase in costs of an electronic device.

DETAILED DESCRIPTION

Figure 1:
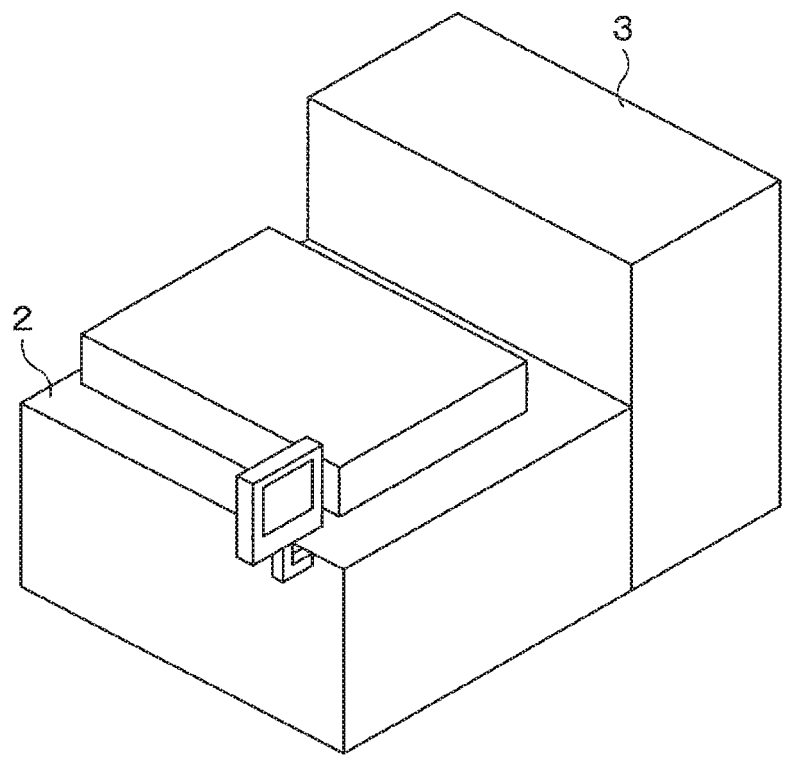
FIG. 1 is a perspective view illustrating the configuration of a testing device according to a first embodiment of the present disclosure.

Hereinafter, embodiments of the present disclosure will be described with reference to the drawings. In the specification and drawings, elements having substantially the same functional configuration will be denoted by the same reference numerals, and redundant explanations will be omitted.

First Embodiment

Figure 2:
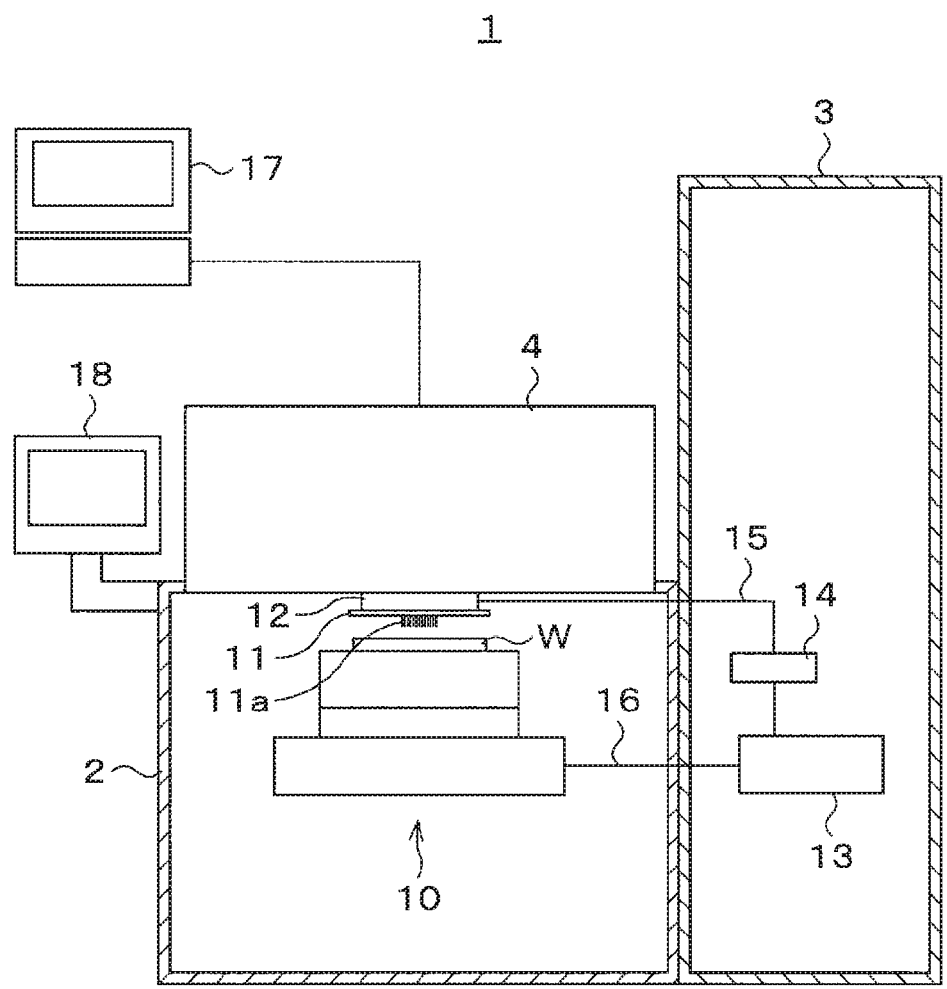
FIG. 2 is a front view schematically illustrating the configuration of the testing device according to the first embodiment of the present disclosure.

FIGS. 1 and 2 are a perspective view and a front view each illustrating the configuration of a prober 1 as a testing device according to a first embodiment of the present disclosure. FIG. 2 illustrates a part of the prober 1 of FIG. 1 in a sectional view in order to show the components housed in an accommodation chamber and a loader of the prober 1 of FIG. 1, which will be described later.

The prober 1 in FIGS. 1 and 2 inspects the electrical characteristics of each of a plurality of electronic devices (see symbol D in FIG. 3 described later) formed on a wafer W as an inspection object. The prober 1 includes an accommodation chamber 2 configured to accommodate a wafer during inspection, a loader 3 disposed adjacent to the accommodation chamber 2, and a tester 4 disposed to cover the accommodation chamber.

The accommodation chamber 2 is a hollow housing, and has a stage 10 to which a wafer W to be inspected is fixed. The stage 10 holds the wafer W by suction such that the position of the wafer W does not shift with respect to the stage 10. The stage 10 is configured to be movable in the horizontal direction and the vertical direction. With this configuration, by adjusting the relative position between a probe card 11 to be described later and the wafer W, it is possible to bring the electrodes on the surface of the wafer W into contact with the probes 11a of the probe card 11.

The probe card 11 is disposed above the stage 10 in the accommodation chamber 2 so as to face the stage 10. The probes 11a are an example of contact terminals according to the embodiment.

The probe card 11 is connected to the tester 4 via an interface 12. When each probe 11a comes into contact with an electrode of each electronic device on the wafer W, each probe 11a supplies power to the electronic device from the tester 4 via the interface 12, or transmits a signal from the electronic device to the tester 4 via the interface 12.

The loader 3 takes out the wafer W accommodated in a FOUP (not illustrated), which is a transport container, and transports the wafer W to the stage 10 in the accommodation chamber 2. In addition, the loader 3 receives the wafer W, on which inspection of the electrical characteristics of electronic devices D has been completed, from the stage 10 and accommodates the wafer W in the FOUP.

In addition, the loader 3 includes a base unit 13 as a controller configured to perform various controls such as a temperature control of an electronic device to be inspected, and a potential difference measurement unit 14 configured to measure a potential difference in a potential difference generation circuit (not illustrated) in each electronic device. The potential difference generation circuit is, for example, a diode, a transistor, or a resistor. The potential difference measurement unit 14 is connected to the interface 12 via a wiring line 15 so as to acquire a potential difference between two probes 11a, which come into contact with two electrodes corresponding to the potential difference generation circuit, and to transmit the acquired potential difference to the base unit 13. The connection structure of each probe 11a and the wiring line 15 in the interface 12 will be described later. The base unit 13 is connected to the stage 10 via a wiring line 16 and controls a light irradiation mechanism 40 to be described later and a flow control valve configured to adjust the flow rate of a coolant flowing to a mounting table 30 to be described later. In addition, the base unit 13 and the potential difference measurement unit 14 may be installed in the accommodation chamber 2, and the potential difference measurement unit 14 may be installed on the probe card 11.

The tester 4 has a test board (not illustrated) for emulating a part of the circuit configuration of a motherboard on which the electronic device is mounted. The test board is connected to a tester computer 17 that determines whether the electronic device is non-defective or defective based on a signal from the electronic device. By replacing the test board in the tester 4, it is possible to emulate the circuit configuration of multiple types of motherboards.

The prober 1 further includes a user interface 18 configured to display information for a user and to allow the user to input a command. The user interface 18 includes, for example, an input part such as a touch panel or a keyboard, and a display part such as a liquid crystal display.

In the prober 1 having the above-described components, when inspecting the electrical characteristics of an electronic device, the tester computer 17 transmits data to a test board connected to the electronic device via each of the probes 11a. Then, the tester computer 17 determines whether the transmitted data has been correctly processed by the test board based on an electric signal from the test board.

Figure 3:
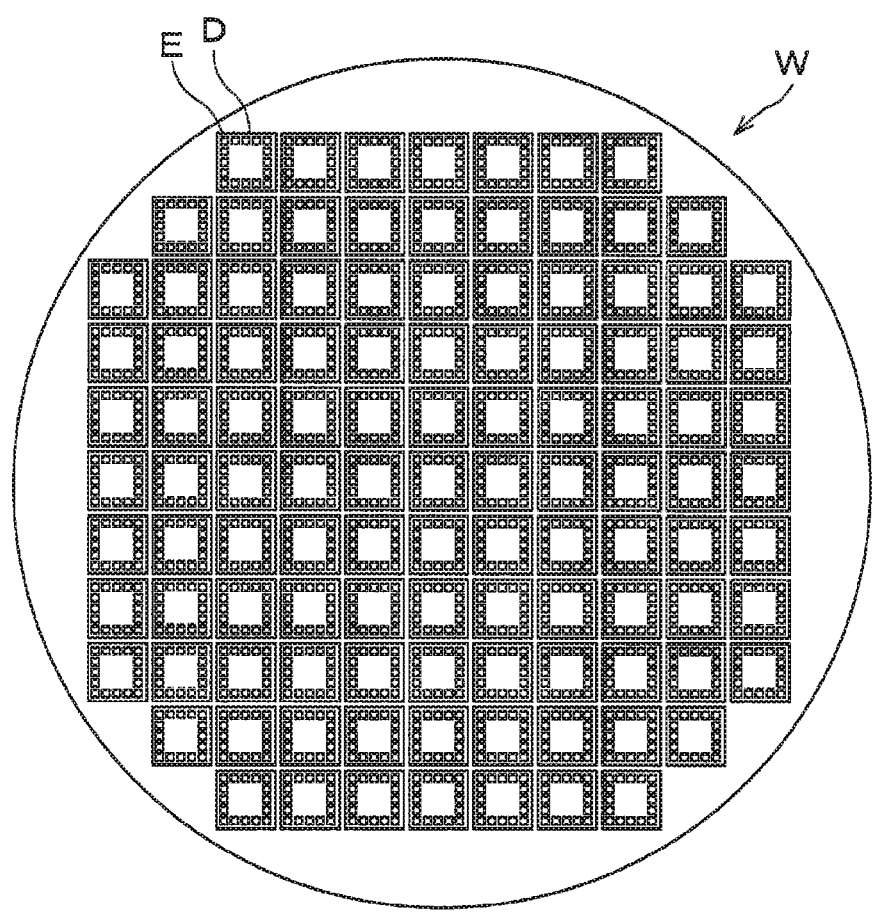
FIG. 3 is a plan view schematically illustrating the configuration of a wafer of an inspection object.

Next, the wafer W, as an inspection object of the above-described prober 1, will be described with reference to FIG. 3. FIG. 3 is a plan view schematically illustrating the configuration of the wafer W.

As illustrated in FIG. 3, a plurality of electronic devices D are formed on the surface of the wafer W with a predetermined interval therebetween by performing an etching process or a wiring process on a substantially disk-shaped silicon substrate. Electrodes E are formed on the electronic devices D, that is, on the surface of the wafer W, and the electrodes E are electrically connected to circuit elements inside the electronic devices D. By applying a voltage to the electrodes E, it is possible to cause a current to flow to a circuit element inside each electronic device D.

Figure 4:
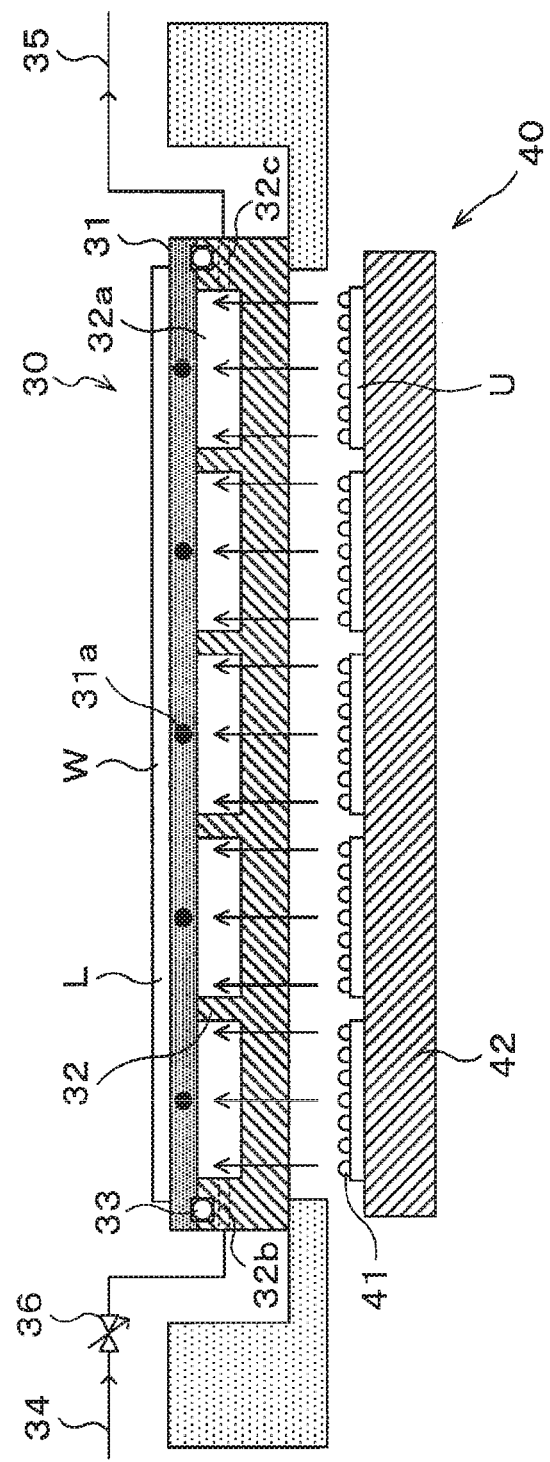
FIG. 4 is a cross-sectional view schematically illustrating the configuration of a stage.
Figure 5:
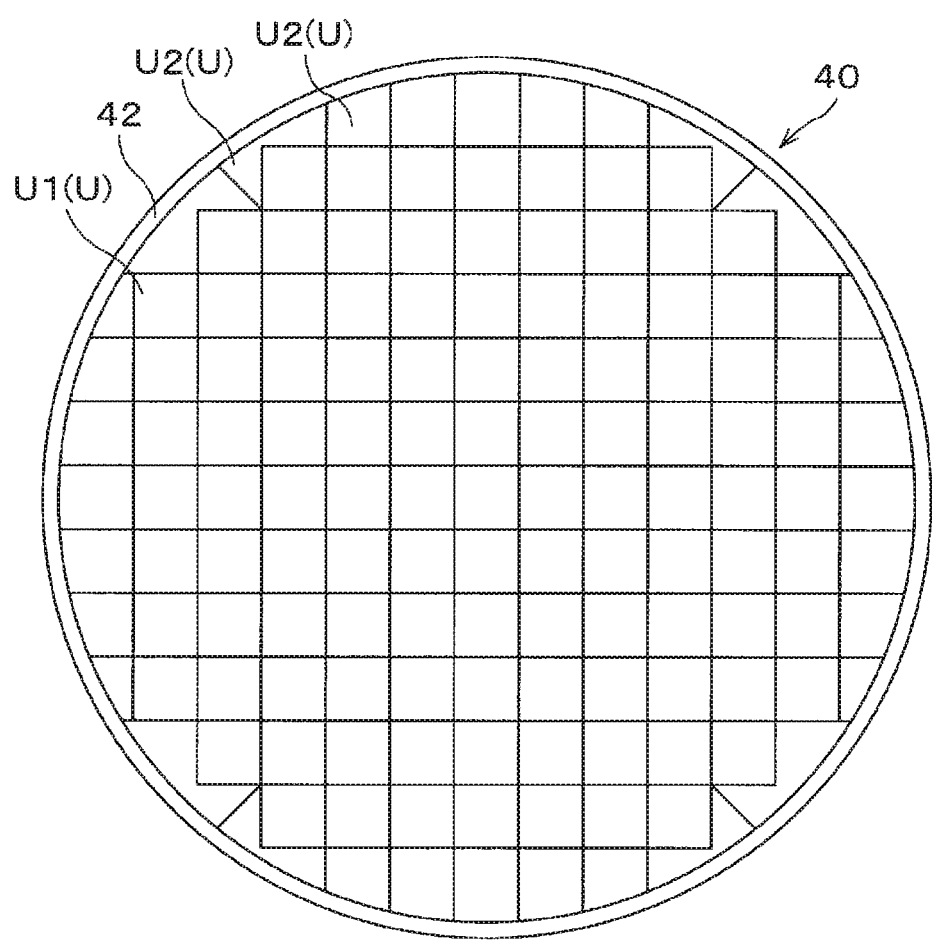
FIG. 5 is a plan view schematically illustrating the configuration of a light irradiation mechanism.

Next, the configuration of the stage 10 will be described with reference to FIGS. 4 and 5. FIG. 4 is a cross-sectional view schematically illustrating the configuration of an upper portion of the stage 10. FIG. 5 is a plan view schematically illustrating the configuration of a light irradiation mechanism 40 to be described later.

As illustrated in FIG. 4, the stage 10 includes the mounting table 30 and the light irradiation mechanism 40 in the upper portion, which are arranged in this order from top. The mounting table 30 is configured to mount a wafer W on the top surface thereof. The light irradiation mechanism 40 irradiates light to a lid member 31 mounted on the mounting table 30 to heat the lid member 31, thereby heating the wafer W to heat the electronic devices D formed on the wafer W.

The mounting table 30 has the lid member 31 on a placement side of the wafer W, that is, a top side, and a bottomed member 32 on a side opposite to the placement side of the wafer W, that is, a bottom side. The lid member 31 and the bottomed member 32 come into contact with each other via an O-ring 33.

The lid member 31 is formed in a disk shape, and is made of, for example, SiC. SiC has a high thermal conductivity and Young's modulus, and also has high absorption efficiency for light from the light irradiation mechanism 40. Accordingly, by forming the lid member 31 using SiC, it is possible to efficiently heat/cool the wafer W mounted on the lid member 31 when the lid member 31 is heated/cooled. In addition, it is possible to prevent cracks or the like from being generated in the lid member 31, and to efficiently heat the lid member 31, that is, the wafer W, by the light from the light irradiation mechanism 40. Further, since a green sheet method or the like may be used for the SiC, the SiC may have high workability, so that the cost of manufacturing the prober 1 can be reduced.

A suction hole (not illustrated) for suctioning the wafer W is formed in the top surface of the lid member 31. In the lid member 31, a plurality of temperature sensors 31a are embedded at positions spaced apart from each other in a plan view.

The bottomed member 32 is formed in a disk shape having substantially the same diameter as the lid member 31, and is formed of a light transmission member that transmits light from the light irradiation mechanism 40. When the light from the light irradiation mechanism 40 is near-infrared light, polycarbonate, quartz, polyvinyl chloride, acrylic resin, or glass may be used as the light transmission member. In addition, since these materials are easy to work and mold, the cost of manufacturing the prober 1 can be reduced.

In addition, on the top surface of the bottomed member 32, a groove for allowing a coolant to flow into the mounting table 30 is formed, and the groove is covered with the lid member 31 so as to form a coolant flow path 32a. In other words, the mounting table 30 has therein the coolant flow path 32a formed by the lid member 31 and the bottomed member 32. In the prober 1, the electronic devices formed on the wafer W are cooled by cooling the wafer W mounted on the mounting table 30 using the coolant flowing through the coolant flow path 32a, that is, heat of the electronic device is absorbed.

A supply port 32b and a discharge port 32c communicating with the coolant flow path 32a are formed in a side portion of the bottomed member 32. The supply port 32b is connected to a supply pipe 34 that supplies the coolant to the coolant flow path 32a, and the discharge port 32c is connected to a discharge pipe 35 that discharges the coolant from the coolant flow path 32a. The supply pipe 34 is provided with a flow control valve 36 configured to control the flow rate of the coolant supplied to the coolant flow path 32a. As the flow control valve 36, a valve for controlling the flow rate of the coolant in a chiller capable of changing the flow rate at a high speed, or the like may be used. It is also possible to apply a three-way valve as the flow control valve 36 so as to provide a bypass flow path that bypasses the coolant flow path 32a. In the case in which the valves of the coolant flow path 32a and the bypass flow path are variable conductance valves, a control can be performed without changing the overall conductance by setting Cv+Cvb to be constant, assuming that the conductance of the coolant flow path 32a is Cv and the conductance of the bypass flow path is Cvb.

As the coolant flowing through the coolant flow path 32a, for example, water that is a liquid through which light can pass is used, and the coolant is supplied to the coolant flow path 32a through the supply pipe 34 by a pump (not illustrated) provided outside the prober 1. The operation of the flow control valve 36 and the like for adjusting the flow rate of the coolant is controlled by the base unit 13.

The light irradiation mechanism 40 is disposed to face a surface of the mounting table 30 on a side opposite to the placement side of the wafer W, in other words, to face a bottom surface of the bottomed member 32.

The light irradiation mechanism 40 has a plurality of LEDs 41 directed toward the wafer W. Specifically, the light irradiation mechanism 40 has a plurality of LED units U in which a plurality of LEDs 41 are unitized, and has a base 42 on which the LED units U are mounted. For example, as illustrated in FIG. 5, the entire surface of the base 42 is substantially covered with the LED units U of units U1 and units U2 included in the light irradiation mechanism 40. The units U1 are arranged in the same manner as the electronic devices D formed on the wafer W while having the number same as the number of the electronic devices D (see FIG. 3), each of which has a square shape in a plan view. The units U2 are arranged to cover the peripheral portion of the base 42, each of which has a non-square shape in a plan view. Thus, the light from the LEDs 41 of the LED units U can be irradiated to the lid member 31, at least the entire of a portion where the wafer W is mounted.

Each LED 41 irradiates light toward the wafer W. In this example, each LED 41 irradiates near-infrared light. The light irradiated from the LEDs 41 (hereinafter, may be abbreviated as "LED light") passes through the bottomed member 32 of the mounting table 30 made of a light transmission member. The light that has passed through the bottomed member 32 passes through a coolant, which is capable of transmitting light, flowing through the coolant flow path 32a of the mounting table 30, and is incident on the lid member 31.

In the light irradiation mechanism 40, the LED light incident on the lid member 31 on which the wafer W is mounted on the mounting table 30 is controlled in units of LED units U. Accordingly, the light irradiation mechanism 40 may irradiate LED light only to an arbitrary position on the lid member 31, or may vary the intensity of the irradiated light between the arbitrary position and the other position.

In the prober 1, the temperature of an electronic device D to be inspected, formed on the wafer W on the mounting table 30, is controlled to be constant at a target temperature by heating using the light from the light irradiation mechanism 40 and heat absorption using the coolant flowing through the coolant flow path 32a. For this temperature control, the prober 1 measures the temperature of the wafer W.

Figure 6:
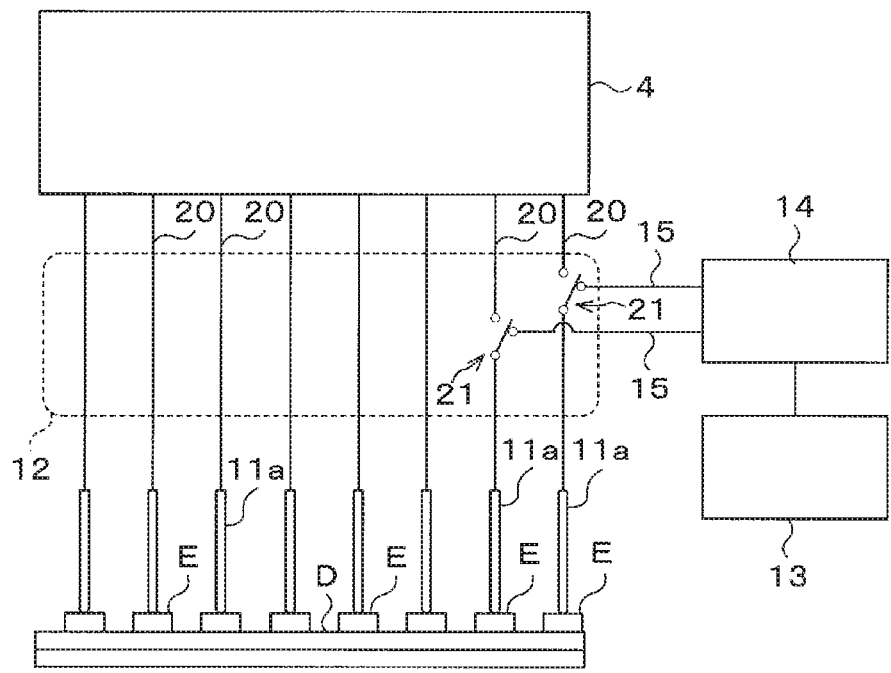
FIG. 6 is a view schematically illustrating the configuration of a circuit for measuring the temperature of a wafer in the testing device shown in FIG. 1.

FIG. 6 is a view schematically illustrating the configuration of a circuit for measuring the temperature of an electronic device D in the prober 1.

In the prober 1, as illustrated in FIG. 6, each probe 11a is connected to the tester 4 by a plurality of wiring lines 20 arranged on the interface 12. Among the wiring lines 20, a relay 21 is installed in each of two wiring lines 20 connecting the tester 4 and two probes 11a that are in contact with two electrodes E of a potential difference generation circuit (e.g., a diode) in the electronic device D.

Each relay 21 is configured to be switched to transmit the potential of each electrode E to any one of the tester 4 and the potential difference measurement unit 14. For example, when inspecting the electrical characteristics of the electronic device D, each relay 21 transmits the potential of each electrode E to the potential differential measurement unit 14 at a predetermined timing after an implementation voltage is applied to each electrode E. Here, it is known that in the potential difference generation circuit, a potential difference generated when a predetermined current flows therein varies depending on temperature. Therefore, based on the potential difference of the potential difference generation circuit of the electronic device D, that is, the potential difference between two electrode pads E (probes 11a) of the potential difference generation circuit, it is possible to measure the temperature of the electronic device D in real time during the inspection. In the prober 1, the potential difference measurement unit 14 acquires the potential difference of the potential difference generation circuit of the electronic device D based on the potential of each electrode E, which is transmitted from each relay 21, and further transmits the acquired potential difference of the potential difference generation circuit to the base unit 13. The base unit 13 measures the temperature of the electronic device D based on the transmitted potential difference and the temperature characteristic of the potential difference generation circuit.

The method of measuring the temperature of the electronic device D is not limited to the above, and any other method may be used as long as the temperature of the electronic device D can be measured.

Figure 7:
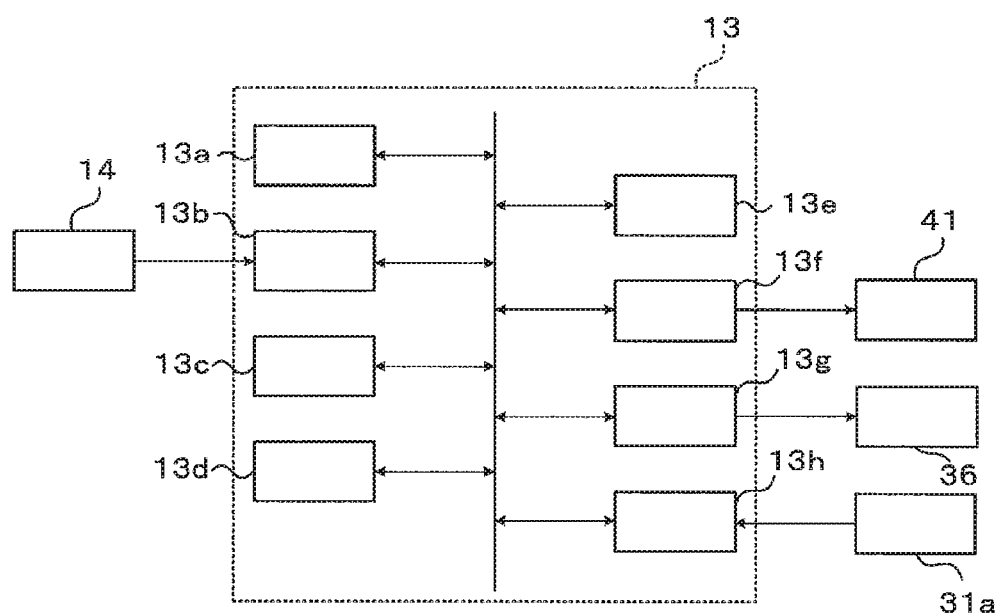
FIG. 7 is a block diagram schematically illustrating the configuration of a base unit.

Next, a configuration relating to the temperature control of the electronic device D of the base unit 13 will be described with reference to FIG. 7. FIG. 7 is a block diagram schematically illustrating the outline of the configuration of a base unit.

The base unit 13 is configured with, for example, a computer, and has a program storage part (not illustrated). The program storage part stores a program for controlling various processes such as a temperature control process of the electronic device D in the prober 1.

The program may be stored in a computer-readable storage medium, such as a computer-readable hard disc (HD), a flexible disc (FD), a compact disc (CD), a magnet optical disc (MO), or a memory card, and may be installed in the base unit 13 from the storage medium.

The base unit 13 includes a storage part 13a, a device temperature information acquisition part 13b, a device temperature calculation part 13c, an LED operation amount determination part 13d, a valve operation amount determination part 13e, an LED control part 13f, a valve control part 13g, and a mounting table temperature acquisition part 13h.

The storage part 13a stores the target temperature of the electronic device D, the target value of the operation amount of the LED 41 of the light irradiation mechanism 40, the temperature of the coolant, and the like. The target value of the operation amount of the LED 41 and the temperature of the coolant are determined in advance based on the target temperature of the electronic device D, the maximum output of the LED 41, and the like. The storage part 13a also stores information on the temperature characteristics of the potential difference of the potential difference generation circuit in the electronic device D.

The device temperature information acquisition part 13b acquires, from the potential difference measurement unit 14, information on the potential difference of the above-described potential difference generation circuit in the electronic device D as information on the temperature of the electronic device D to be inspected.

The device temperature calculation unit 13c calculates the temperature of the electronic device D to be detected, based on the potential difference of the potential difference generation circuit of the electronic device to be inspected and the temperature characteristics of the potential difference of the potential difference generation circuit, in which the potential difference of the potential difference generation circuit and the temperature characteristics of the potential difference of the potential difference generation circuit are obtained from the information acquired from the device temperature information acquisition part 13b.

The LED operation amount determination part 13d serves to perform a feedback control (e.g., a PID control) such that the temperature of the electronic device D to be inspected becomes constant at the target temperature, and determines the operation amount of the LED 41. Specifically, the LED operation amount determination part 13d calculates, for example, a deviation between the temperature of the electronic device D calculated by the device temperature calculation part 13c and the target temperature of the electronic device D stored in the storage part 13a, and calculates/determines the operation amount of the LED 41 corresponding to the electronic device D to be inspected by the PID operation based on the deviation.

The valve operation amount determination part 13e serves to perform a feedback control (e.g., a PID control) such that the operation amount of the LED 41, which is determined by the LED operation amount determination part 13d, is constant at a target value, and determines the operation amount of the flow control valve 36 for controlling the flow rate of the coolant flowing through the coolant flow path 32a of the mounting table 30. Specifically, for example, the valve operation amount determination part 13e calculates a deviation between the operation amount of the LED 41 calculated by the LED operation amount determination part 13d, and a target value of the operation amount of the LED 41 stored in the storage part 13a, and calculates/determines the operation amount of the flow control valve 36 by the PID operation, based on the deviation. The information on the temperature of the coolant necessary for calculating the operation amount of the flow control valve 36 is stored in the storage part 13a.

The LED control part 13f adjusts the light output of the LED 41, based on the operation amount calculated by the LED operation amount determination part 13d. Thus, the heating of the electronic device D to be inspected or the like by the light from the LED 41 is controlled.

The valve control part 13g adjusts the opening degree of the flow control valve 36, based on the operation amount calculated by the valve operation amount determination part 13e and adjusts the flow rate of the coolant flowing through the coolant flow path 32a inside the mounting table 30. Thus, the heat absorption from the electronic device D to be inspected or the like by the coolant is controlled.

With the configuration described above, the base unit 13 controls the heating by the light output from the LED 41 corresponding to the electronic device D based on the temperature of the electronic device D to be inspected, and also controls the heat absorption by the coolant in the coolant flow path 32a of the mounting table 30 based on the light output from the LED 41, so as to control the temperature of the electronic device D to be inspected. In other words, with the above-described configuration, the base unit 13 performs a cascade control in which the operation amount related to the light output from the LED 41 having a fast response is a master side and the operation amount related to the flow rate of the coolant having a slow response is the slave side. The control method based on the temperature control of the base unit 13 is a sliding mode control using both a linear element and a non-linear element. The light output from the LED 41 is used as the linear element, and the flow rate of the coolant is used as the non-linear element. In the sliding mode control, a control operation amount is usually divided into a linear control operation amount and a non-linear control operation amount. The linear control operation amount makes the control deviation of the state of a control system minimized on a switching hyperplane, and the nonlinear control operation amount makes the state of the control system directed toward the switching hyperplane when there is a modeling error or an uncertain disturbance.

The mounting table temperature acquisition part 13h of the base unit 13 acquires information on the temperature of the mounting table 30, specifically, information on the temperature of the lid member 31 from the temperature sensor 31a.

Next, an exemplary inspection process on a wafer W using the prober 1 will be described.

First, the wafer W is taken out of a FOUP of the loader 3, transported to the stage 10, and mounted thereon. Next, the stage 10 is moved to a predetermined position.

Then, all the LEDs 41 of the light irradiation mechanism 40 are turned on, and the light output from the LEDs 41 and the flow rate of the coolant flowing in the mounting table 30 are adjusted based on the information acquired from the temperature sensor 31a of the lid member 31 such that the temperature of the lid member 31 is made to be uniform in the plane.

In this state, the potential difference of the above-described potential difference generation circuit in the electronic device D to be inspected is acquired by the potential difference measurement unit 14. Then, the temperature of the lid member 31, which is made to be uniform in the plane, is substantially matched to the temperature of the electronic device D to be inspected such that the potential difference is calibrated. In other words, the information on the temperature characteristics of the potential difference is corrected.

Thereafter, the stage 10 is moved so as to bring the electrodes E of the electronic device D to be inspected in the wafer W into contact with the probes 11a installed on the stage 10.

Then, an inspection signal is input to the probes 11a. Thereby, the inspection of the electronic device D is started. During the inspection, based on the information on the potential difference generated in the potential difference generation circuit of the electronic device D to be inspected, the light output from the LEDs 41 of the LED unit U corresponding to the device, that is, the voltage applied to the LEDs 41, is controlled so that the temperature of the electronic device D becomes a test temperature/target temperature, and the flow rate of the coolant in the mounting table 30, that is, the opening degree of the flow control valve 36, is controlled so that the output from the LEDs 41 becomes a target value.

Thereafter, the steps after the calibration of the potential difference of the potential difference generation circuit in the electronic device D are repeated until the inspection of all of the electronic devices D is completed.

Hereinafter, the effects of the present embodiment will be described.

In the present embodiment, the flow rate of the coolant in the mounting table 30 can be controlled using the flow control valve 36. In addition, since the light irradiation mechanism 40 is disposed to face the bottomed member 32 located on the side opposite to the placement side of the wafer W in the mounting table 30, and the bottomed member 32 is formed of a light transmission member, the coolant flowing in the coolant flow path 32a of the mounting table 30 is also capable of transmitting light. Therefore, the LED light from each LED 41 is capable of reaching the lid member 31 of the mounting table 30 through the coolant and the like. In addition, the light irradiation mechanism 40 is capable of locally irradiating the lid member 31 with the LED light by each LED unit U. As described above, if the flow rate of the coolant can be controlled by the flow control valve 36, the temperature of the electronic device D may be controlled only by controlling the flow rate of the coolant regardless of how the LED light is controlled. However, in the present embodiment, the temperature of the electronic device D is controlled by controlling the LED light as well. Specifically, while cooling the entire lid member 31 by the coolant in the mounting table 30, the lid member 31 is locally irradiated with LED light so as to heat only the electronic device D under inspection. That is, in the wafer W, other electronic devices D are cooled while controlling the temperature of only the electronic device D under inspection. Therefore, it is possible to suppress a thermal load from the electronic device D under inspection from being applied to other electronic device D. As a result, an implementation voltage can be applied to the desired electronic device D, so that a problem occurring at the time of applying the implementation voltage can be found before packaging. Thus, it is possible to suppress decrease in package yield and thus to prevent an increase in costs. In addition, the light irradiation mechanism 40 may locally change the intensity of light irradiated to the lid member 31 by each LED unit U. Thus, the irradiation state of the LED light to the lid member 31 may be locally changed while cooling the entire lid member 31 using the coolant in the mounting table 30. Accordingly, the heating state of the electronic device D under inspection may be made to be different from that of other electronic devices. In other words, it is possible to perform the inspection of the electronic device D to be inspected while controlling the temperature of both the electronic device D to be inspected and the other electronic devices D in the wafer W.

In batch contact probing employed in a D-RAM or the like, the entire surface of the light irradiation mechanism 40 is turned on so as to adjust the distribution. In this mode, since the calorific value of the wafer is small, the calorific value can be adjusted only by the irradiation amount of the LEDs.

In the present embodiment, the heat absorption from the electronic device by the coolant is controlled by adjusting the flow rate of the coolant having a fast response instead of adjusting the temperature of the coolant having a slow response. Then, as described above, the base unit 13 controls the heating by the light output from the LEDs 41 corresponding to the electronic device D, based on the temperature of the electronic device D to be inspected, and also controls the heat absorption by the coolant in the coolant flow path 32*a* of the mounting table 30 based on the light output from the LEDs 41, so as to control the temperature of the electronic device D to be inspected.

Unlike the present embodiment, when only the heating by the light output from the LEDs is controlled to make the heat absorption from the electronic device by the coolant constant, it is necessary to use LEDs having a large maximum output or to increase the density of LEDs in order to reduce the temperature increase of the electronic device when the calorific value of the electronic device becomes very large. However, LEDs 41 having a large maximum output are expensive, and when the density of LEDs 41 increases, the cost increases. In addition, when using LEDs 41 having a large maximum output or increasing the density of LEDs 41, it is necessary to cool the LEDs 41 themselves.

In contrast, in the present embodiment, since control is performed as described above, it is not necessary to use LEDs 41 having a large maximum output or to increase the number of LEDs 41. Therefore, it is possible to prevent an increase in costs and it is unnecessary to cool the LEDs 41. Further, since the failure rate of the LEDs 41 is low when the LEDs 41 are not cooled, the reliability of the prober 1 can be maintained.

In the present embodiment, water is used as the coolant that absorbs heat. Therefore, heat absorption by the coolant can be performed at a higher speed compared to the case where a CFC-based coolant is used.

In the present embodiment, since water is used as the coolant related to heat absorption and SiC is used for the lid member 31 of the mounting table 30, a temperature response characteristic is high.

In addition, in the present embodiment, when inspecting an electronic device D, it is not necessary to cut out the electronic device D as a chip, and the inspection can be performed in wafer units.

Second Embodiment

Figure 8:
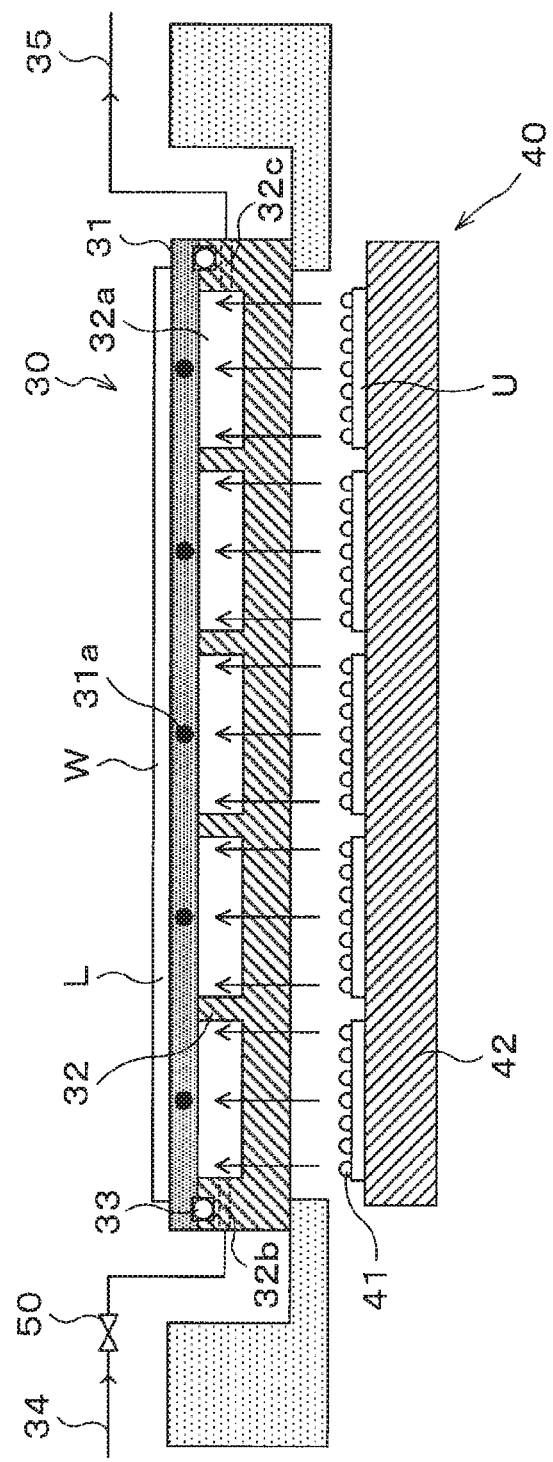
FIG. 8 is a cross-sectional view schematically illustrating the configuration of an upper portion of a stage included in a testing device according to a second embodiment of the present disclosure.
Figure 9:
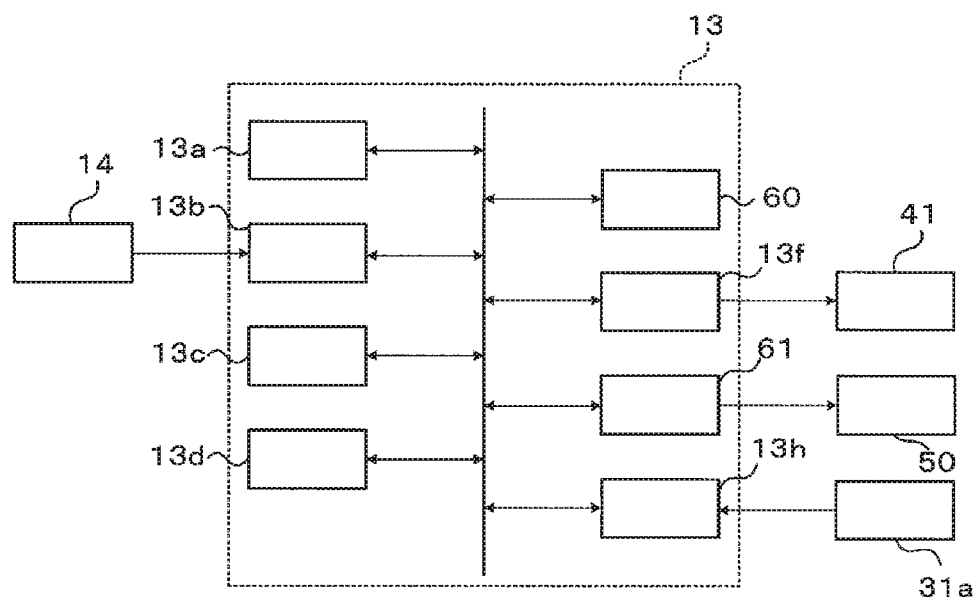
FIG. 9 is a block diagram schematically illustrating the configuration of a base unit according to the second embodiment of the present disclosure.

FIGS. 8 and 9 are views for explaining a prober as a testing device for an electronic device according to a second embodiment of the present disclosure. FIG. 8 is a cross-sectional view schematically illustrating the configuration of an upper portion of a stage included in the prober. FIG. 9 is a block diagram schematically illustrating the outline of the configuration of the base unit of the prober.

In the prober of the first embodiment, as illustrated in FIG. 4, the control of the heat absorption from the electronic device by the coolant is performed using the flow control valve 36 configured to control the flow rate of the coolant. In contrast, in the prober of the second embodiment, as illustrated in FIG. 8, the control of heat absorption from the electronic device by the coolant is performed using a high-speed switching valve 50 configured to switch between execution and interruption of the supply of the coolant. In the following description, with respect to the high-speed switching valve 50, the state in which the supply of the coolant is performed may be referred to as an "ON state", and the state in which the supply of the coolant is interrupted may be referred to as an "OFF state".

As the high-speed switching valve 50, a gas valve or the like, which is used in an atomic layer deposition (ALD) film forming apparatus and is capable of switching between execution and interruption of the supply of a coolant at a high speed, may be used.

In addition, the coolant in the present embodiment is also water.

As illustrated in FIG. 9, the base unit 13 of the present embodiment includes a valve operation amount determination part 60 and a valve control part 61.

The valve operation amount determination part 60 serves to perform a feedback control such that the operation amount of an LED 41 determined by the LED operation amount determination part 13*d* falls within a predetermined range from a target value. The valve operation amount determination part 60 determine the operation amount of the high-speed switching valve 50. Specifically, for example, the valve operation amount determination part 60 determines the operation amount of the high-speed switching valve 50, based on whether the operation amount of the LED 41 calculated by the LED operation amount determination part 13*d* has exceeded a predetermined value (the target value).

In addition, when the switching time of the high-speed switching valve 50 is theoretically zero, an object to be controlled is locked on a hyperplane, and thus the sliding mode may be realized. However, the switching time of the high-speed switching valve 50 is actually a finite time and causes chattering. Thus, the valve operation amount determination part 60 causes the predetermined value to have a hysteresis. That is, when the high-speed switching valve 50 is in the OFF state, the operation amount of the high-speed switching valve 50 is determined such that the high-speed switching valve 50 is switched to the ON state when the operation amount of the LED 41, calculated by the LED operation amount determination part 13*d*, exceeds the target value by a predetermined value. When the high-speed switching valve 50 is in the ON state, the operation amount of the high-speed switching valve 50 is determined such that the high-speed switching valve 50 is switched to the OFF state when the operation amount of the LED 41 falls below a value obtained by subtracting the predetermined value from the target value. The information about the hysteresis, that is, the predetermined value, is stored in the storage part 13*a*.

It may be said that the valve operation amount determination part 60 performs a feedback control such that the average value of the operation amounts of the LED 41, determined by the LED operation amount determination part 13*d*, becomes constant at the target value.

The valve control part 61 switches between opening and closing of the high-speed switching valve 50 based on the operation amount determined by the valve operation amount determination part 60. Thus, the heat absorption from the electronic device D or the like by the coolant is controlled.

In the present embodiment, during the inspection of the electronic device D, based on the information on the potential difference generated in the potential difference generation circuit of the electronic device D, the light output from the LED 41 is controlled such that the temperature of the electronic device becomes the test temperature/target temperature, and switching between execution and interruption of the supply of the coolant in the mounting table 30, that is, opening and closing of the high-speed switching valve 50 is controlled such that the average value of the outputs from the LED 41 becomes the target value.

In the present embodiment as well, the base unit 13 controls the heating by the light output from the LED 41 corresponding to the electronic device D based on the temperature of the electronic device D to be inspected, and also controls the heat absorption by the coolant in the coolant flow path 32a of the mounting table 30 based on the light output from the LED 41, so as to control the temperature of the electronic device D to be inspected. Accordingly, it is not necessary to use LEDs 41 having a large maximum output or to increase the number of LEDs 41. Therefore, it is possible to prevent an increase in costs and it is unnecessary to cool the LEDs 41. Further, since the failure rate of the LEDs 41 is low when the LEDs 41 are not cooled, the reliability of the prober 1 can be maintained.

In the present embodiment, unlike the flow control valve 36, the high-speed switching valve 50 does not require a motor, and thus it is possible to suppress costs and to achieve space saving.

In the present embodiment, since the target value of the operation amount of the LED 41 is given a hysteresis, it is possible to lock an object to be controlled on a hyperplane without causing chattering.

In the present embodiment as well, the control method based on the temperature control of the base unit 13 is a sliding mode control using both a linear element and a non-linear element. The light output from the LED 41 is used as the linear element, and switching of the supply (execution/interruption) of the coolant is used as the non-linear element.

Third Embodiment

Figure 10:
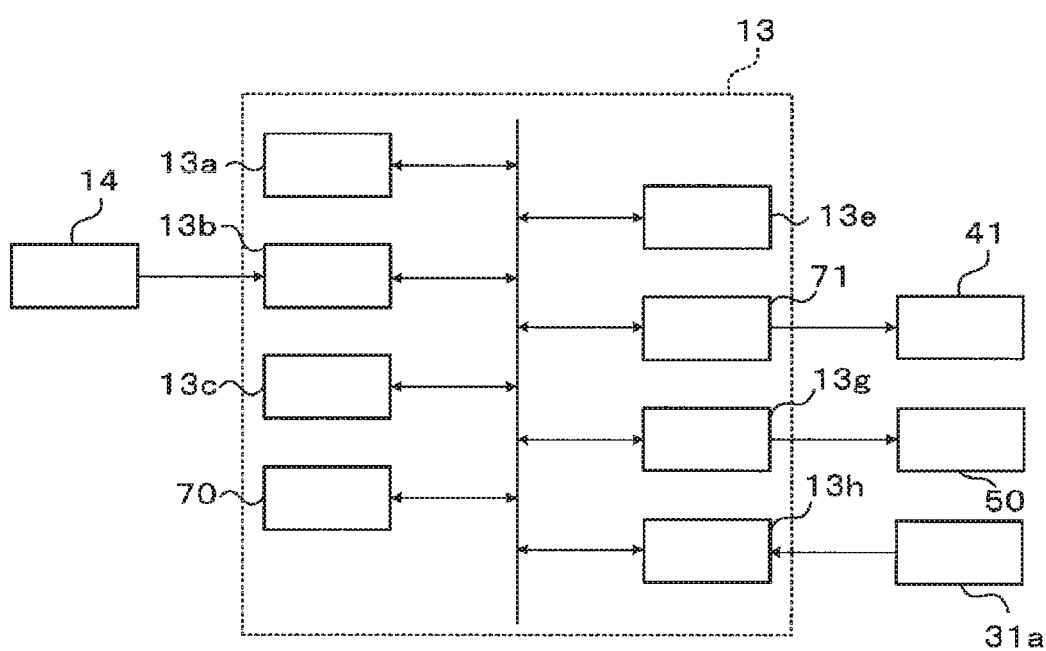
FIG. 10 is a block diagram schematically illustrating the configuration of a base unit according to a third embodiment of the present disclosure.

FIG. 10 is a view for explaining a prober as a testing device for an electronic device according to a third embodiment of the present disclosure, and is a block diagram schematically illustrating the configuration of a base unit included in the prober.

In the prober of the present embodiment, as illustrated in FIG. 10, the base unit 13 includes an LED operation amount determination part 70 and an LED control part 71.

The LED operation amount determination part 70 serves to perform a feedback control such that the temperature of the electronic device D to be inspected becomes constant at the target temperature, and determines the operation amount of the LED 41 based on the temperature of the electronic device D and the temperature of the mounting table 30. Specifically, the LED operation amount determination part 70 calculates, for example, a deviation between the temperature of the electronic device D calculated by the device temperature calculation part 13c and the target temperature of the electronic device D stored in the storage part 13a and performs estimation of the temperature of the mounting table 30. The above estimation is performed, for example, by time-integrating the deviation. Then, the LED operation amount determination part 70 calculates a deviation between the estimated temperature of the mounting table 30 and the temperature of the mounting table 30 acquired via the mounting table temperature acquisition part 13h, and calculates/determines the operation amount of the LED 41 corresponding to the electronic device D to be inspected based on the deviation. That is, the LED operation amount determination part 70 calculates/determines the operation amount of the LED 41 by performing state feedback using the temperature of the mounting table 30 as a state amount.

The LED control part 71 adjusts the light output of the LED 41, based on the operation amount calculated by the LED operation amount determination part 70. Thus, the heating of the electronic device D to be inspected or the like by the light from the LED 41 is controlled.

In the prober of the present embodiment, when performing a feedback control of the temperature of the electronic device D to be inspected, state feedback is performed using the temperature of the mounting table 30 (more specifically, the lid member 31) as a state amount. Accordingly, the temperature of the electronic device D to be inspected can be controlled more accurately.

The present embodiment is also applicable to the case where heat absorption is controlled by switching between execution and interruption of supply of the coolant using the high-speed switching valve 50 as the valve.

The above example is an example in which the number of electronic devices D to be simultaneously inspected is one. However, each of the above-described embodiments is applicable to a case where a plurality of electronic devices D are simultaneously inspected. In this case, the operation amount related to the heat absorption by the coolant is determined, for example, such that the average value of the operation amount of each LED corresponding to each electronic device becomes constant at the target value.

The embodiments of the present disclosure have been described above, but the present disclosure is not limited to the examples. It will be apparent to those ordinarily skilled in the art that various modifications or changes can be conceived within the scope of the technical idea described in the claims, and it will be understood that the modifications or changes naturally fall within the technical scope of present disclosure.

EXAMPLES

FIGS. 11A and 11B to FIGS. 16A and 16B show simulation results of the temperatures of electronic devices when the electronic devices to be inspected instantaneously generate heat in Comparative Examples 1 and 2 and Test Examples 1 to 4. In each drawing, the horizontal axis represents time, the left vertical axis represents the temperature of the electronic device, and the calorific value of the electronic device. The right vertical axis represents the LED operation amount in FIGS. 11A, 11B, 12A and 12B, represents the opening degree of the flow control valve of a coolant in FIGS. 13A, 13B, 14A and 14B, and represents the opened/closed state of the high-speed switching valve in FIGS. 15A, 15B, 16A and 16B. In the right vertical axis in FIGS. 15A, 15B, 16A and 16B, "1" indicates that the valve is in the opened state and "0" indicates that the valve is closed. Each figure B is a partially enlarged view of each figure A.

Comparative Examples 1 and 2 show simulation results when a prober for comparison was used. The prober for comparison was different from the prober of the first embodiment only in the method of controlling the temperature of the electronic device. The prober for comparison controls the temperature of the electronic device only by controlling the heating by the light output while making the heat absorption by the coolant constant. Test Examples 1 and 2 are simulation results when the prober of the above-described first embodiment was used. Test Examples 3 and 4 are simulation results when the prober of the above-described second embodiment was used.

In the above simulations, it was assumed that the electronic devices generated heat for about 10 seconds after about 80 seconds elapsed. The coolant was water, the material of the lid member 31 of the mounting table 30 was SiC, the maximum output of the LED was 90 W, and the target operation amount of the LED was 30 W. Further, except for Test Example 4, the target temperature of the electronic device was 85 degrees C., and the target temperature in Test Example 4 was 105 degrees C. The calorific value of the electronic device was 50 W in Comparative Example 1, 100 W in Comparative Example 2, 200 W in Test Example 1, 300 W in Test Examples 2 and 3, and 765 W in Test Example 4.

Figure 11A:
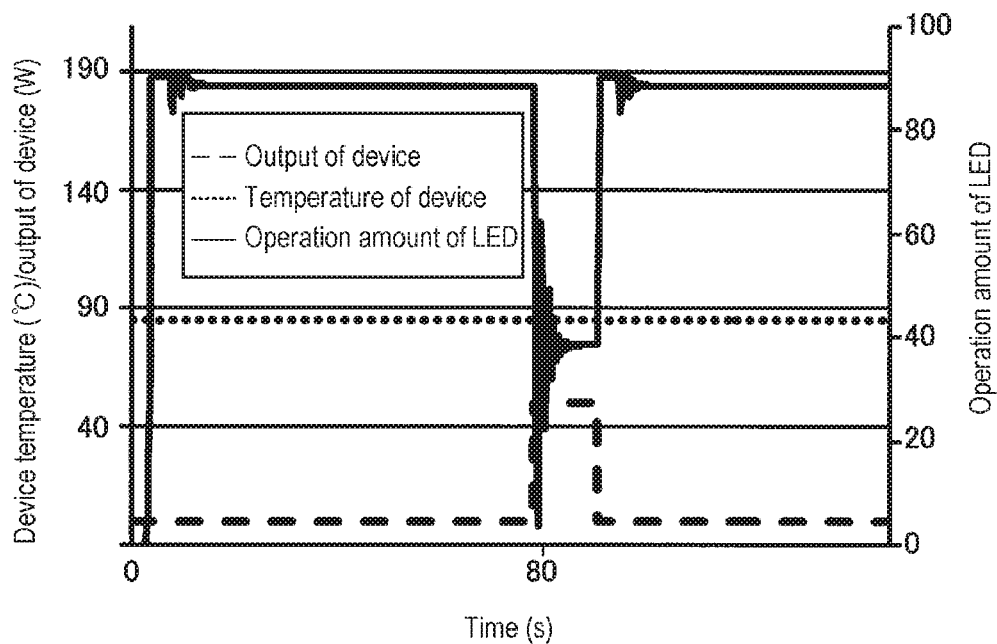
FIGS. 11A and 11B are views illustrating a simulation result (Comparative Example 1) of the temperature of an electronic device to be inspected when the electronic device instantaneously generates heat.
Figure 11B:
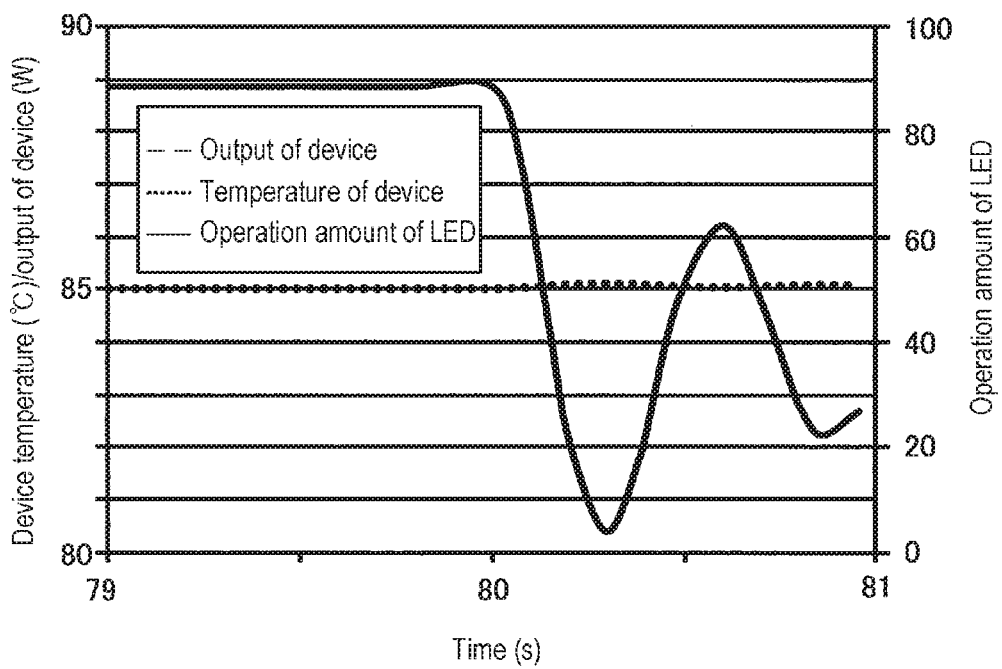
Figure 12A:
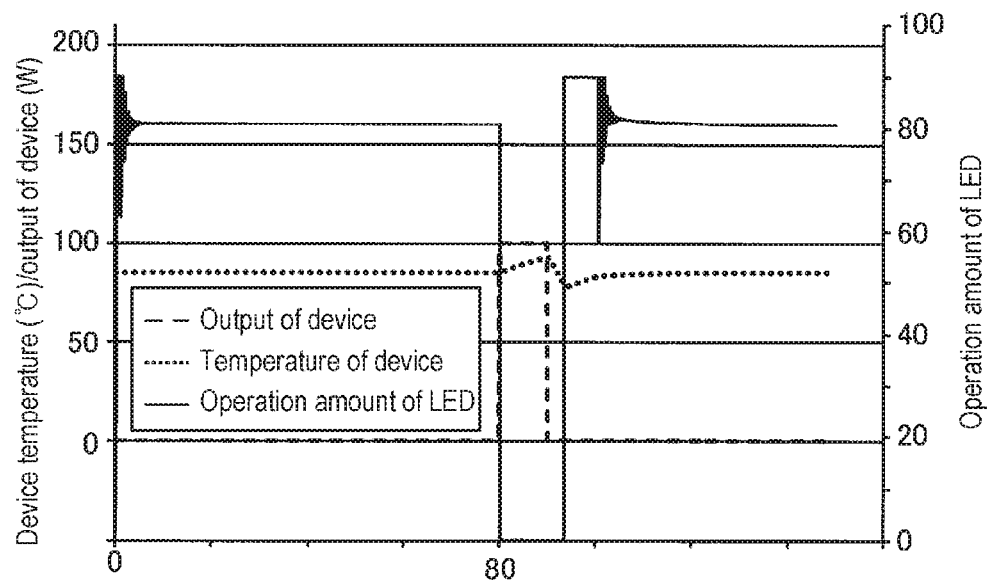
FIGS. 12A and 12B are views illustrating a simulation result (Comparative Example 2) of the temperature of an electronic device to be inspected when the electronic device instantaneously generates heat.
Figure 12B:
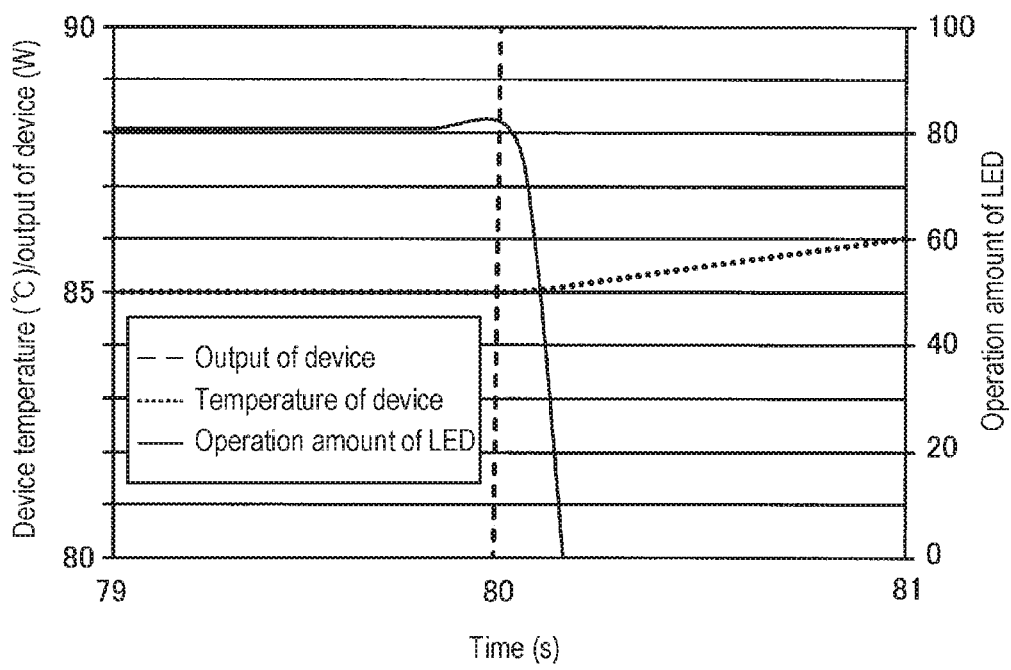

In the above-described probe for comparison, as is apparent from Comparative Example 1 in FIGS. 11A and 11B, if the calorific value of the electronic device is as small as 50 W, it is possible to control the temperature within a suitable range from the target temperature (within the target temperature+3 degrees C.). However, as is apparent from Comparative Example 2 in FIGS. 12A and 12B, when the calorific value of the electronic device reaches 100 W, the temperature of the electronic device rises from the target temperature to fall outside the suitable range, specifically, to 92.7 degrees C.

Figure 13A:
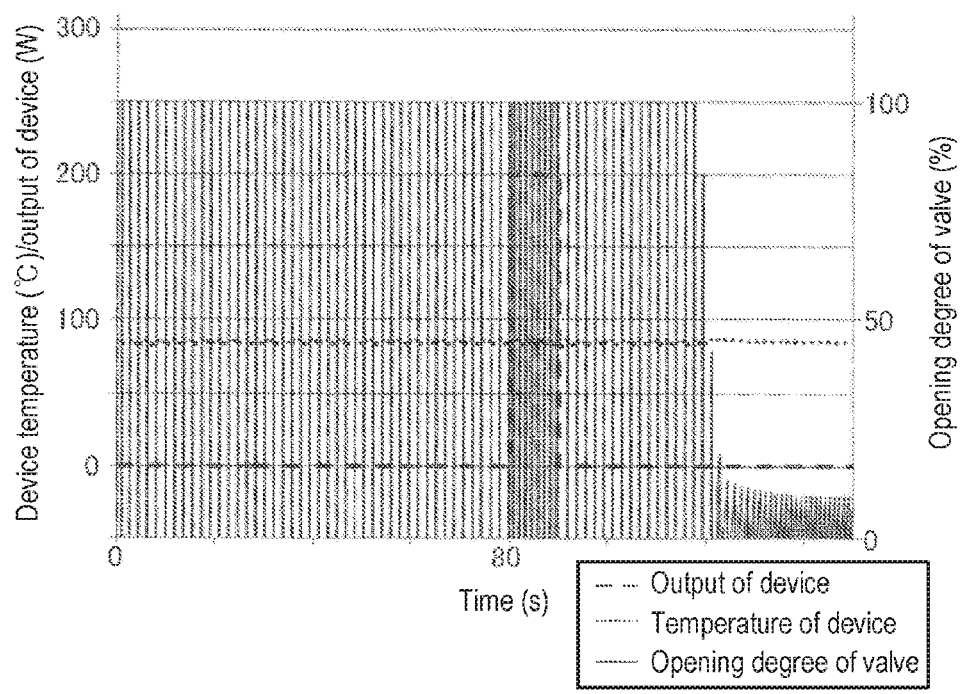
FIGS. 13A and 13B are views illustrating a simulation result (Test Example 1) of the temperature of an electronic device to be inspected when the electronic device instantaneously generates heat.
Figure 13B:
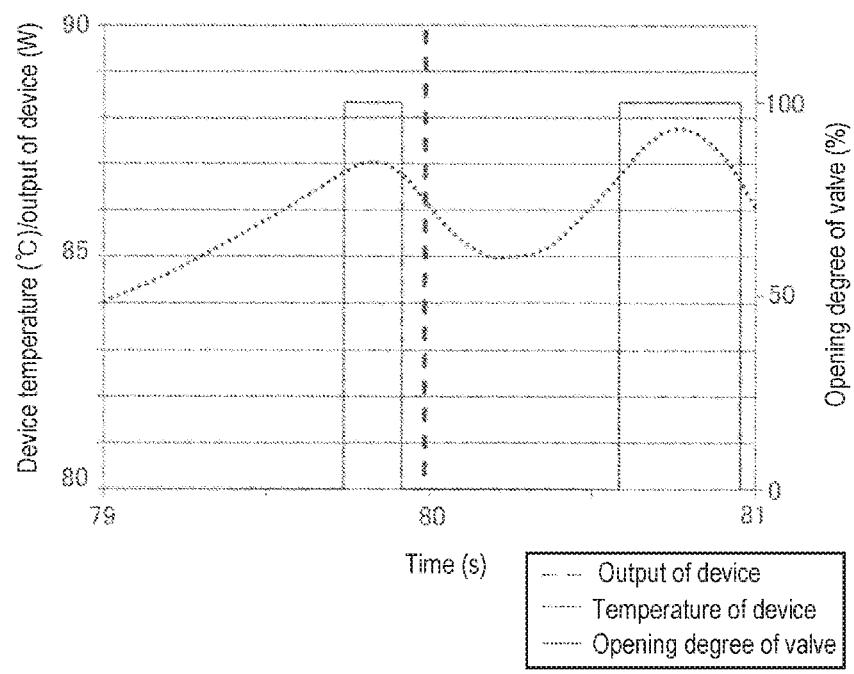
Figure 14A:
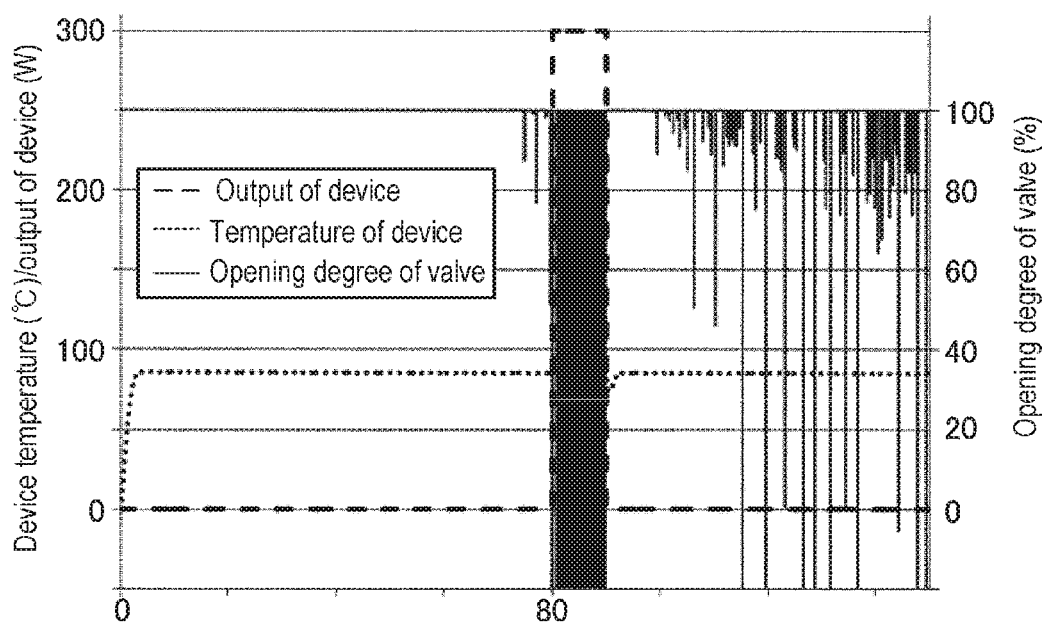
FIGS. 14A and 14B are views illustrating a simulation result (Test Example 2) of the temperature of an electronic device to be inspected when the electronic device instantaneously generates heat.
Figure 14B:
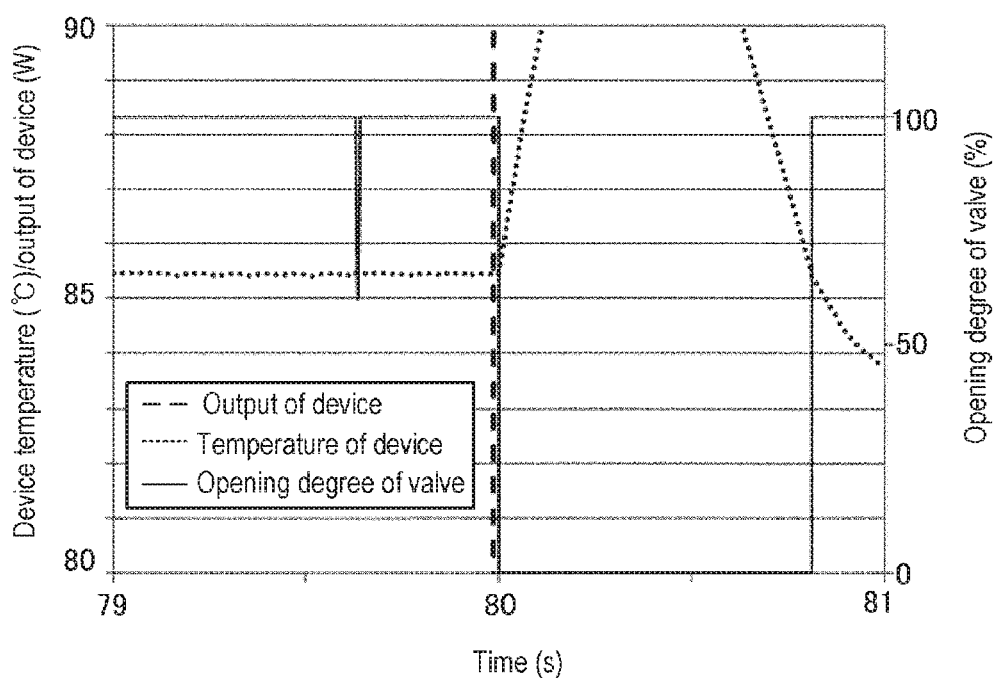

In contrast, in the prober of the first embodiment, as is clear from Test Example 1 in FIGS. 13A and 13B, even when the calorific value of the electronic device is 200 W, which is larger than that in Comparative Example 2, it is possible to control the temperature of the electronic device within the suitable range from the target temperature, that is, to 88 degrees C. or lower. However, in the prober of the first embodiment, when the calorific value of the electronic device is very large, for example, at 300 W, as in Test Example 2 in FIGS. 14A and 14B, the temperature rises to 93.8 degrees C.

Figure 15A:
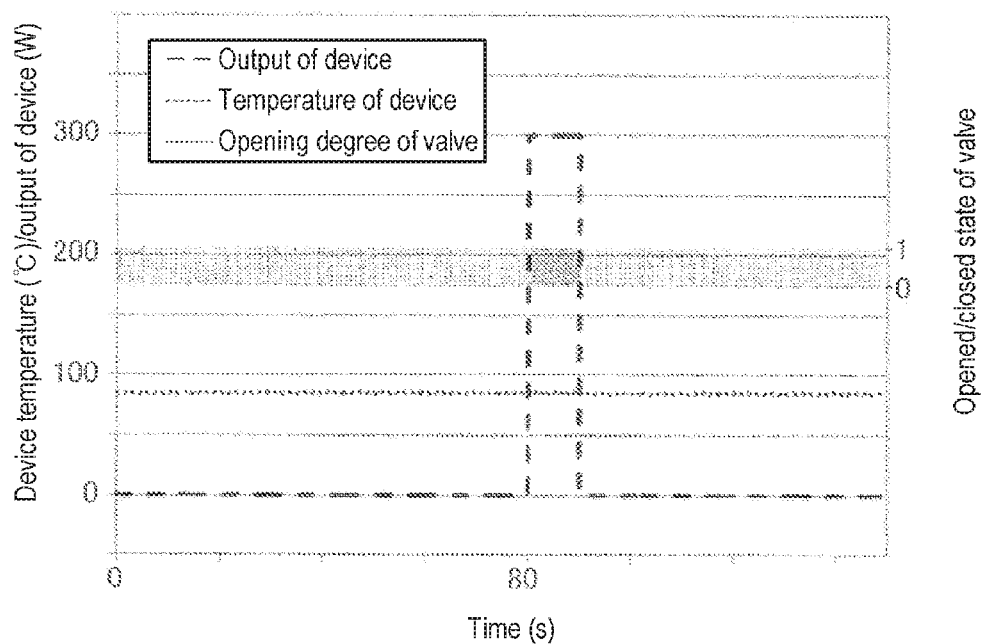
FIGS. 15A and 15B are views illustrating a simulation result (Test Example 3) of the temperature of an electronic device to be inspected when the electronic device instantaneously generates heat.
Figure 15B:
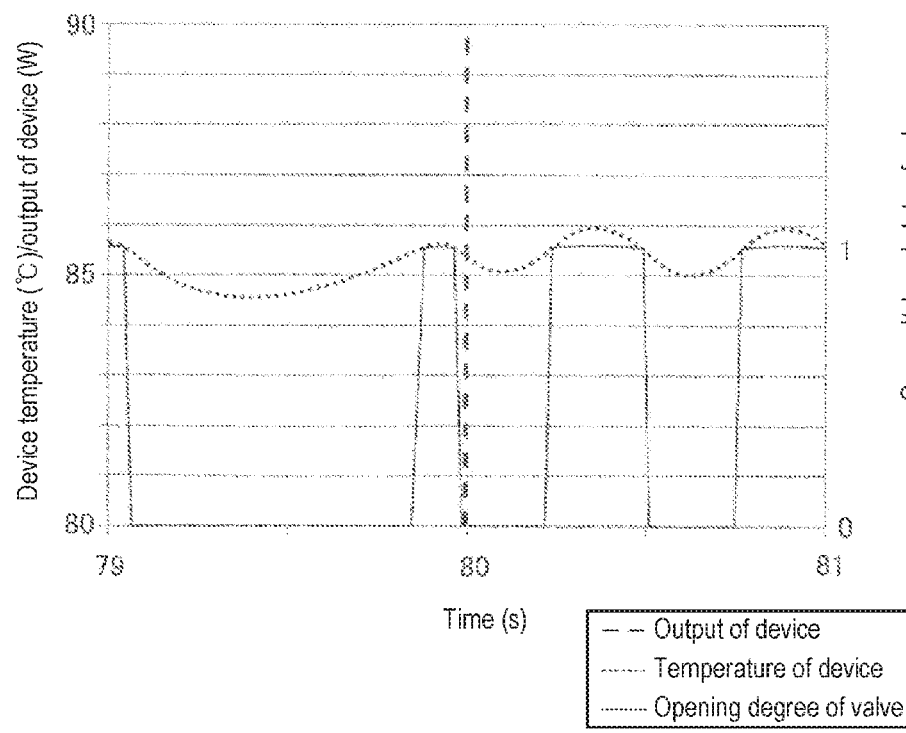
Figure 16A:
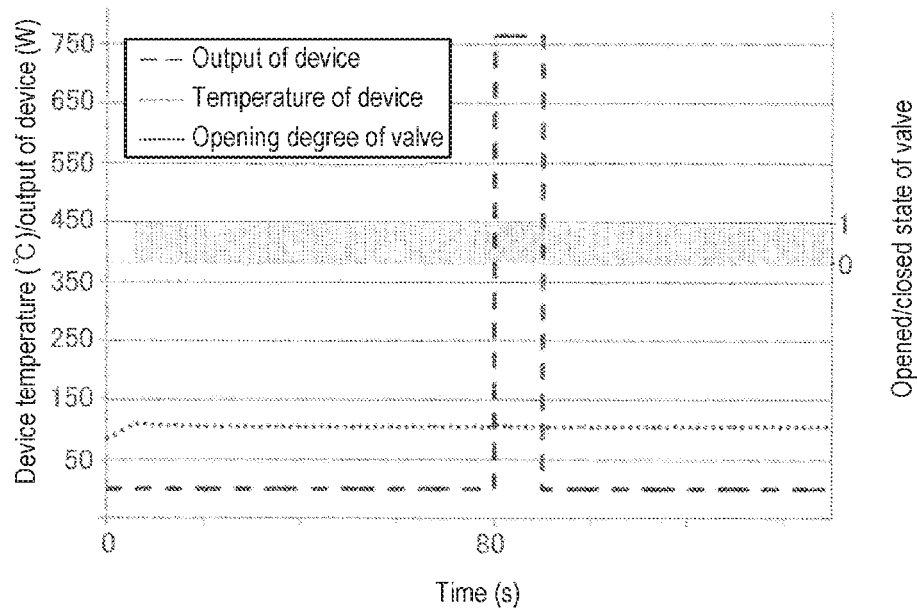
FIGS. 16A and 16B are views illustrating a simulation result (Test Example 4) of the temperature of an electronic device to be inspected when the electronic device instantaneously generates heat.
Figure 16B:
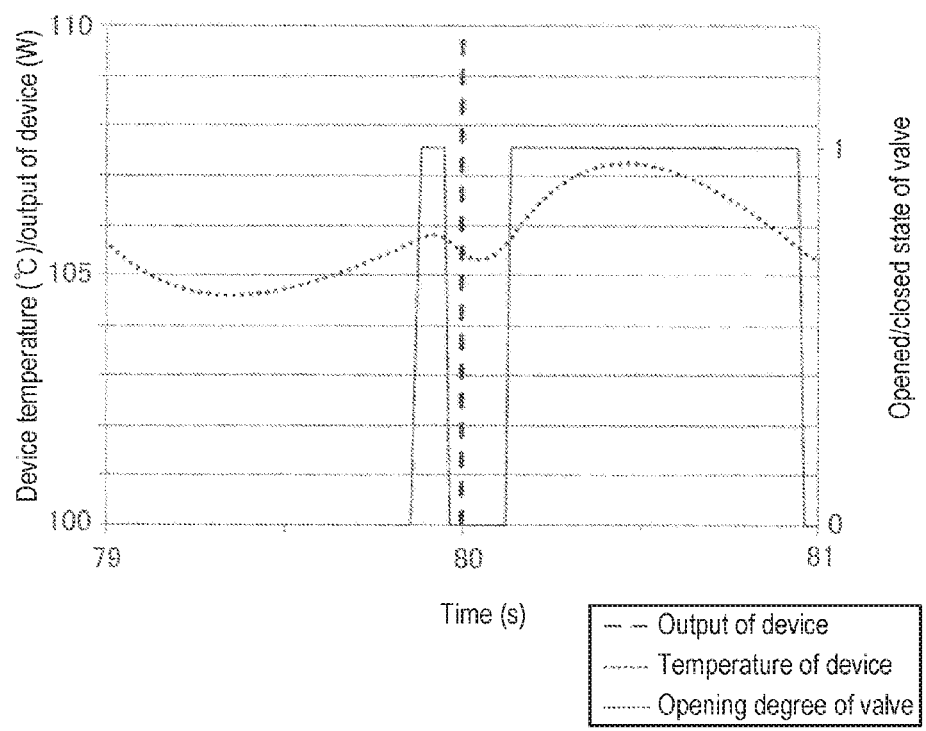

Meanwhile, in the prober of the second embodiment, as is clear from Test Example 3 in FIGS. 15A and 15B, even when the electronic device has a very large calorific value of 300 W, the temperature of the electronic device has a value very close to the target temperature of 85.9 degrees C. at the maximum, and can be controlled within a range very close to the target temperature. Furthermore, in the prober of the second embodiment, when the calorific value of the electronic device is larger, for example, as in Test Example 4 in FIGS. 16A and 16B, even in the case where the calorific value is 765 W, which is twice or more of that in Test Example 3, when the target temperature is 105 degrees C., the temperature of the electronic device is 107.2 degrees C., which is at most 2.2 degrees higher than the target temperature, and can be controlled within a suitable range from the target temperature.

INDUSTRIAL USE OF THE PRESENT INVENTION

The present disclosure is useful for technology for inspecting electronic devices.

EXPLANATION OF REFERENCE NUMERALS

1: prober, 2: accommodation chamber, 3: loader, 4: tester, 10: stage, 11: probe card, 11a: probe, 12: interface, 13: base unit, 13a: storage part, 13b: device temperature information acquisition part, 13c: device temperature calculation part, 13d, 70: LED operation amount determination part, 13e, 60: valve operation amount determination part, 13f, 71: LED control part, 13g, 61: valve control part, 13h: mounting table temperature acquisition part, 14: potential difference measurement unit, 17: tester computer, 18: user interface, 31a: temperature sensor, 32: bottomed member, 32a: coolant flow path, 36: flow control valve, 40: light irradiation mechanism, 41: LED, 50: high-speed switching valve, E: electrode, U: LED unit, W: wafer

What is claimed is:

1. A testing device that brings a contact terminal into electrical contact with an electronic device formed on an inspection object so as to inspect the electronic device, the testing device comprising:
   a mounting table including a coolant flow path through which a coolant capable of transmitting light flows, a placement side of the inspection object formed by a lid member and a side which is opposite the placement side of the inspection object and formed by a light transmission member, the mounting table being configured to mount the inspection object on the placement side formed by the lid member;
   a light irradiation mechanism having LEDs disposed to face a surface on the side opposite the placement side of the inspection object of the mounting table, the LEDs being directed toward the inspection object; and
   a controller configured to control heat absorption by the coolant and heating by light from the LEDs so as to control a temperature of the electronic device to be inspected,
   wherein the lid member and the light transmission member come into contact with each other, and
   wherein the controller is configured to:
     control a light output from the LEDs based on at least a measured temperature of the electronic device to be inspected; and
     control the heat absorption by the coolant based on the light output of the LEDs.

2. The testing device of claim 1, wherein the controller is configured to:
   control the light output of the LEDs such that the temperature of the electronic device to be inspected becomes constant; and
   control the heat absorption by the coolant such that the light output of the LEDs becomes constant.

3. The testing device of claim 2, wherein the controller is configured to control, based on the measured temperature of the electronic device to be inspected and a measured temperature of the mounting table, the light output of the LEDs such that the temperature of the electronic device to be inspected becomes constant.

4. The testing device of claim 2, wherein the controller is configured to control the heat absorption by the coolant such that the light output of the LEDs becomes constant by controlling a flow rate of the coolant.

5. The testing device of claim 3, wherein the controller is configured to control the heat absorption by the coolant such that the light output of the LEDs becomes constant by controlling a flow rate of the coolant.

6. The testing device of claim 2, wherein the controller is configured to control the heat absorption by the coolant by switching between execution and interruption of supply of the coolant based on whether the light output of the LEDs exceeds a predetermined value.

7. The testing device of claim 3, wherein the controller is configured to control the heat absorption by the coolant by switching between execution and interruption of supply of the coolant based on whether the light output of the LEDs exceeds a predetermined value.

8. The testing device of claim 6, wherein the controller causes the predetermined value to have a hysteresis.

9. The testing device of claim 7, wherein the controller causes the predetermined value to have a hysteresis.

\* \* \* \* \*